(12) United States Patent
Lee et al.

(10) Patent No.: US 6,455,226 B1
(45) Date of Patent: Sep. 24, 2002

(54) PHOTORESIST POLYMERS AND PHOTORESIST COMPOSITION CONTAINING THE SAME

(75) Inventors: Geun Su Lee; Jae Chang Jung; Hyeong Soo Kim; Ki Ho Baik, all of Kyoungki-do (KR)

(73) Assignee: Hyundai Electronics Industries Co., Ltd. (KR)

( * ) Notice: Subject to any disclaimer, the term of this patent is extended or adjusted under 35 U.S.C. 154(b) by 27 days.

(21) Appl. No.: 09/704,053

(22) Filed: Nov. 1, 2000

(30) Foreign Application Priority Data

Nov. 3, 1999 (KR) .............................. 99-48294

(51) Int. Cl.[7] .......................... C08F 232/04; G03F 7/039
(52) U.S. Cl. .................... 430/270.1; 430/905; 430/322; 430/909; 522/109; 522/289; 525/60; 525/74
(58) Field of Search .................... 430/270.1, 281.1, 430/286.1, 905, 311, 322, 330; 522/109, 289; 525/60, 74

(56) References Cited

U.S. PATENT DOCUMENTS

| | | | |
|---|---|---|---|
| 6,159,655 A | * 12/2000 | Sato ........................ | 430/270.1 |
| 6,270,942 B1 | * 8/2001 | Choi ........................ | 430/270.1 |
| 6,277,538 B1 | * 8/2001 | Choi et al. ................ | 430/270.1 |
| 6,359,093 B1 | * 3/2002 | Takaki et al. ............. | 526/307.6 |
| 6,368,773 B1 | * 4/2002 | Jung et al. ................ | 430/281.1 |

| | | | |
|---|---|---|---|
| 2001/0024763 A1 | * 9/2001 | Choi et al. ................ | 430/270.1 |
| 2002/0018960 A1 | * 2/2002 | Lee et al. ................ | 430/270.1 |

FOREIGN PATENT DOCUMENTS

| | | | |
|---|---|---|---|
| JP | 2001187807 A | * 7/2001 | ......... C08F/232/04 |

* cited by examiner

*Primary Examiner*—Janet Baxter
*Assistant Examiner*—Yvette M. Clarke
(74) *Attorney, Agent, or Firm*—Townsend and Townsend and Crew LLP

(57) ABSTRACT

The present invention provides photoresist polymers and photoresist compositions comprising the same. In one aspect, the photoresist polymer is of the Formula:

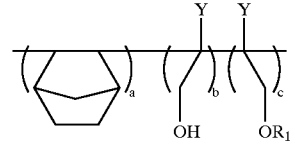

where Y, $R_1$, a, b and c are as described herein. Photoresist compositions of the present invention have good transmittance at wavelengths of 193 nm and 157 nm, etching resistance, heat resistance, and adhesiveness. In addition, photoresist compositions of the present invention can be developed easily in aqueous TMAH solution, and are therefore suitable for lithography processes using VUV (157 nm) and EUV (13 nm) wavelength-light sources for fabricating a minute circuit of a high integration semiconductor device.

20 Claims, No Drawings

PHOTORESIST POLYMERS AND PHOTORESIST COMPOSITION CONTAINING THE SAME

BACKGROUND OF THE INVENTION

1. Field of the Invention

The present invention relates to photoresist polymers and photoresist compositions comprising the same. Photoresist polymers and photoresist compositions of the present invention are suitable for a photolithography process employing a deep ultraviolet light source, preferably vacuum ultraviolet (VUV, 157 nm) or extreme ultraviolet (EUV, 13 nm).

2. Description of the Background Art

A photoresist (PR) polymer for an ArF or VUV photolithography process should have a variety of physical characteristics, such as low absorbency of 193 nm and 157 nm wavelengths, and excellent etching resistance and adhesiveness. In addition, the photoresist should be easily developable in a commercially readily available developing solution, such as 2.38 wt % or 2.6 wt % aqueous tetramethylammonium hydroxide (TMAH) solution.

There has been much research done on resins having a high transparency at a wavelength of 193 nm and dry etching resistance similar to Nobolac resin. However, most of the photoresists are not suitable for VUV due to their poor transmittance at 157 nm wavelength. Photoresists containing fluorine and silicon have good transmittance at these wavelengths. Unfortunately, most photoresists containing fluorine with a polyethylene or polyacrylate polymer backbone have weak etching resistance, low solubility in an aqueous TMAH solution and poor adhesiveness to the silicon wafer. In addition, these photoresists are difficult to mass-produce and are expensive. Furthermore, during a post-exposure bake (PEB) process these photoresist can generate HF which can contaminate a lens or corrode a device. Thus, these photoresists are generally not suitable for commercial use. On the other hand, photoresists containing silicon require a 2-step process such as HF treatment and $O_2$ treatment during the etching process. And because it is difficult to remove HF completely, these types of photoresists are generally not suitable in the production of semiconductor devices.

SUMMARY OF THE INVENTION

An object of the present invention is to provide photoresist polymers having a good transmittance at wavelengths of 157 nm or 13 nm, etching resistance, adhesiveness and photosensitivity, and a process for preparing the same.

Another object of the present invention is to provide photoresist compositions comprising the PR polymers described above, and a process for preparing the same.

Still another object of the present invention is to provide a semiconductor element produced by using the photoresist composition.

DETAILED DESCRIPTION OF THE INVENTION

One aspect of the present invention provides a photoresist polymer of the Formula:

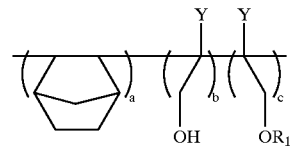

wherein

Y is H;

$R_1$ is a hydroxy protecting group; and the ratio of a:b:c is 10–90 mol %:5–45 mol %:5–45 mol %, preferably 50 mol %:5–45 mol %:5–45 mol %. The terminal groups in Formula 4 depends on the polymerization initiator and polymerization terminator.

As used throughout this disclosure, it should be appreciated that the order of each monomeric units represented in a polymer formula of the present invention does not necessarily indicate the actual order of such monomeric units in the actual polymer. The monomeric units represented in polymer formulas are intended to simply indicate the presence of such monomeric unit in the polymer. Moreover, the variables represent the total relative ratio of each units. For example, the total amount "a" of polymeric units derived from norborylene of Formula 4 above can be inter dispersed throughout the polymer (not necessarily in same concentrations) or all or majority of such polymeric unit can be concentrated in one particular location of the polymer.

Variety of hydroxy protecting groups are known to one of ordinary skill in the art. Exemplary hydroxy protecting groups can be found in, for example, *Protective Groups in Organic Synthesis,* 3rd edition, T. W. Greene and P. G. M. Wuts, John Wiley & Sons, New York, 1999, which is incorporated herein by reference in its entirety. Preferably, the hydroxy protecting group is an acetal. More preferably, the hydroxy protecting group is of the formula: —CH($CH_3$)$OR_4$, where each $R_4$ is independently optionally substituted linear or branched ($C_1$–$C_{20}$) alkyl or aryl, or 5–7 membered cyclic lactam.

Examples of preferred polymers of the present invention include, but are not limited to:

<Chemical Formula 4a>

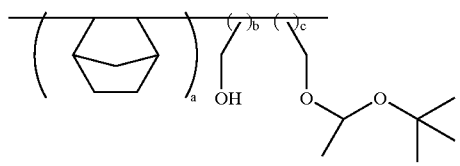

<Chemical Formula 4b>

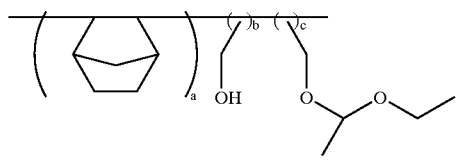

<Chemical Formula 4c>

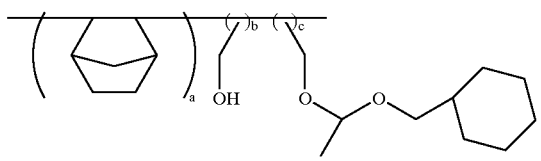

wherein the ratio of a:b:c is 10–90 mol %:5–45 mol %:5–45 mol %.

Polymers of the present invention can be prepared by a variety of methods. In one particularly preferred method, polymers of the present invention are prepared by (1) synthesizing a copolymer of alicyclic monomer and maleic anhydride (or a derivative of maleic anhydride; (2) esterifying the copolymer; and (3) reducing the esterified copolymer to lower light absorbency in the wavelength of 157 nm.

In one particular embodiment of the present invention, a process for preparing photoresist polymer of the Formula 4 comprises the steps of:

(a) polymerizing norbornylene and a maleic anhydride derivative to produce a polymer of Formula 1;
(b) contacting the polymer of Formula 1 with an alcohol to produce a polymer of Formula 2;
(c) contacting the polymer of Formula 2 with a reducing agent to produce a polymer of Formula 3; and
(d) reacting the polymer of Formula 3 with a hydroxy protecting group precursor to produce at least a partially hydroxy protected polymer of Formula 4.

<Chemical Formula 1>
<Chemical Formula 2>
<Chemical Formula 3>

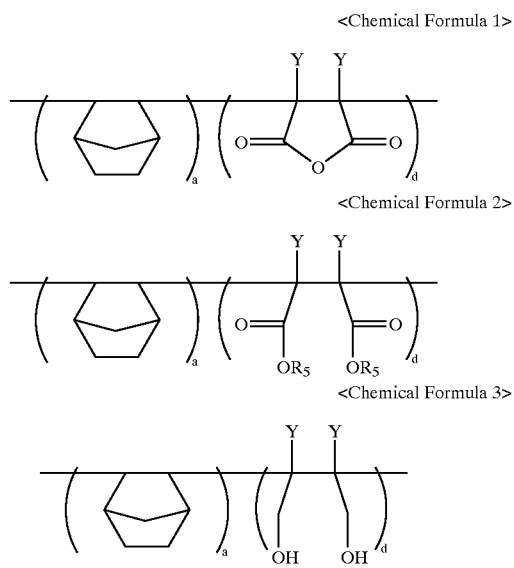

wherein,
Y is H; and
the ratio of a:d is 10–90 mol %:10–90 mol %.

The alcohol in step (b) is preferably a lower alcohol of the formula $R_5OH$, where $R_5$ is $(C_1-C_5)$ alkyl, more preferably, the alcohol is methanol. The degree of esterification is generally determined by the amount of $R_5OH$ used. For example, when an excess amount of $R_5OH$ is used in step (b), theoretically all the carboxylic acid groups in Formula 1 can be esterified. However, it is possible that 5% or less of carboxylic acid group remains unesterified depending on a variety of factors such as reaction conditions including the purity of $R_5OH$.

In one embodiment, the reducing agent in step (c) is preferably $NaBH_4$.

Alternatively, the polymer of Formula 3 can be prepared from the polymer of Formula 1 by reducing the polymer of Formula 1 directly. In such a process, the reducing agent is preferably $LiAlH_4$.

As used herein, the term "hydroxy protecting group precursor" refers to a compound which when reacted with a hydroxy functional group results in the protection of the hydroxy functional group. Such hydroxy protecting group precursors are well known to one of ordinary skill in the art and include compounds that are disclosed in the above disclosed *Protective Groups in Organic Synthesis,* 3rd edition, which was previously incorporated by reference in its entirety. In one particular embodiment, the hydroxy protecting group precursor is a $(C_1-C_{20})$ alkyl or aryl vinyl ether compound, including tert-butylvinylether, ethylvinylether and cyclohexylvinylether.

The polymerization can be conducted in an organic solvent. Preferably, the polymerization solvent is selected from the group consisting of tetrahydrofuran, dimethylformamide, dimethylsulfoxide, dioxane, benzene, toluene and xylene. The polymer can be separated and/or purified by crystallization. Preferably the polymer crystallization solvent is selected from the group consisting of diethylether, petroleum ether, water, lower alcohols (such as methanol, ethanol, and isopropanol), and mixtures thereof.

One particular embodiment for preparing photoresist polymers of the present invention is illustrated in Reaction Scheme 1:

<Reaction Formula 1>

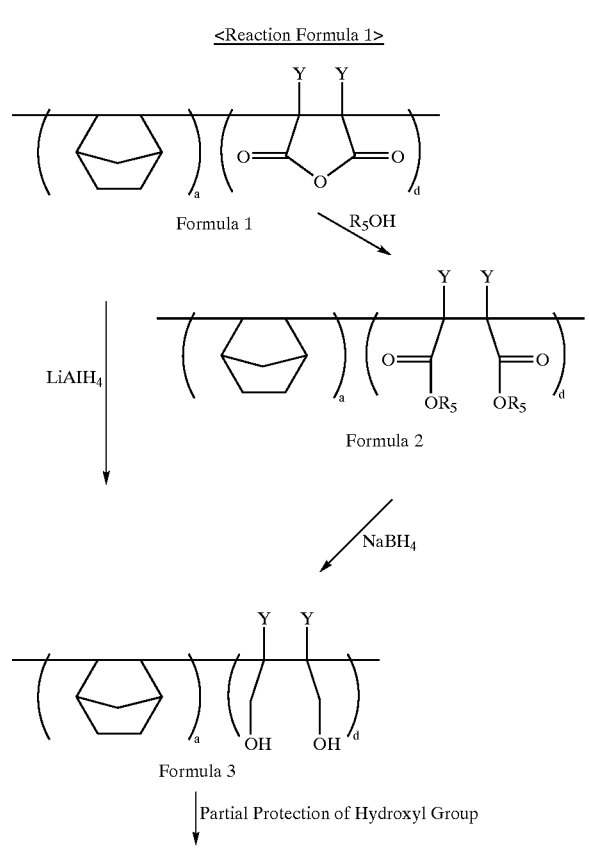

-continued

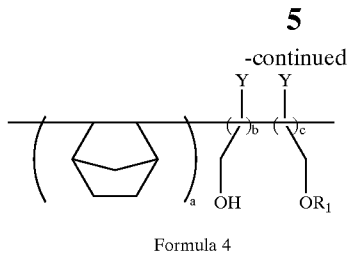

Formula 4 where $R_1$, $R_5$, Y, a, b, c, and d are those defined above.

Another aspect of the present invention provides polymers of Formulas 2 and 3. These polymers can be used as intermediate polymers in the preparation of photoresist polymers of Formula 4.

Yet another aspect of the present invention provides a photoresist composition comprising a photoresist polymer described above, a photoacid generator, and an organic solvent.

Preferred photoacid generators have a relatively low light absorbency in the wavelengths of 157 nm and 193 nm. More preferably, the photoacid generator is selected from the group consisting of phthalimidotrifluoromethane sulfonate, dinitrobenzyltosylate, n-decyl disulfone and naphthylimido trifluoromethane sulfonate.

The photoacid generator can further comprise a compound selected from the group consisting of diphenyl iodide hexafluorophosphate, diphenyl iodide hexafluoroarsenate, diphenyl iodide hexafluoroantimonate, diphenyl p-methoxyphenyl triflate, diphenyl p-toluenyl triflate, diphenyl p-isobutylphenyl triflate, triphenylsulfonium hexafluoroarsenate, triphenylsulfonium hexafluoroantimonate, triphenylsulfonium triflate and dibutylnaphthylsulfonium triflate.

Typically, the amount of photoacid generator used is from about 0.1% by weight to about 10% by weight of the photoresist resin employed.

Exemplary organic solvents suitable in PR compositions of the present invention include ethyl 3-ethoxypriopionate, methyl 3-methoxypropionate, cyclohexanone, propylene glycol methyl ether acetate, n-heptanone and ethyl lactate. The amount of solvent used is preferably in the range of from about 400 % to about 1500% by weight of the PR polymer. This ratio has been found to be particularly useful in obtaining a photoresist layer of a desirable thickness when coated on to a suitable substrate such as a silicon wafer in production of a semiconductor element. In particular, it has been found by the present inventors that when the amount of organic solvent is about 1000% by weight of the photoresist polymer, a photoresist composition layer having 0.2 μm of thickness can be obtained.

The present invention also provides a process for forming a photoresist pattern comprising the steps of:
 (a) coating a photoresist composition described above on a substrate of semiconductor device to form a photoresist film;
 (b) exposing the photoresist film to light using a light source; and
 (c) developing the exposed photoresist film.

The process for forming the photoresist pattern can further include a baking step before and/or after the exposure step (b). Preferably, the baking step is performed at temperature in the range of from about 70 to about 200° C.

Exemplary light sources which are useful for forming the PR pattern include VUV (157 nm), ArF (193 nm), KrF (248 nm), EUV (13 nm), E-beam, X-ray and ion beam.

The irradiation energy is preferably in the range of from about 1 mJ/cm² to about 30 mJ/cm².

In another embodiment, the present invention provides a semiconductor device, which is manufactured using the photoresist composition described above.

Additional objects, advantages, and novel features of this invention will become apparent to those skilled in the art upon examination of the following examples thereof, which are not intended to be limiting.

I. Preparation of Photoresist Polymer

EXAMPLE 1.

Synthesis of Polymer of Chemical Formula 4a (Step 1) Synthesis of poly(norbornene/maleic anhydride)

To 50 mL of tetrahydrofuran was added 0.2M of norbornylene, 0.2M of maleic anhydride and 0.4 g of AIBN. The resulting mixture was stirred at 67° C. for 8 hours. Thereafter, the polymer was precipitated and filtered in petroleum ether/ether(1/1) solution, to obtain poly (norbornene/maleic anhydride) of Formula 1 (yield 58%).

(Step 2) Synthesis of poly(norbornene/ dimethylfumalate)

To 300 mL of methanol was added 19.2 g of poly (norbornene/maleic anhydride) obtained in (Step 1) and 0.1 mL of sulfuric acid. The resulting solution was refluxed for 20 hours. After cooling the resultant solution, 100 mL of water was added. The esterified resin was precipitated, filtered and dried, to obtain poly(norbornene/ dimethylfumalate) of Formula 2 (yield 96%).

(Step 3) Synthesis of poly(norbornene/2-butene-1,4-diol)

To 300 mL of ethanol was added 16 g of polymer synthesized in (Step) 2. To this mixture was slowly added 2.6 g of $NaBH_4$. Thereafter, and the resultant solution was refluxed for 12 hours. The resulting solution was partially concentrated by distillation, and rediluted by adding 100 mL of acetone. The resulting solution was stirred for 20 minutes to quench any residual $NaBH_4$, and concentrated by distillation to remove acetone. The residue was diluted with 200 mL of 1 M aqueous HCl solution and stirred for 30 minutes. Poly(norbornene/2-butene-1,4-diol) of Formula 3 was obtained by filtration (yield 82%).

(Step 4) Synthesis of Polymer of Chemical Formula 4a

To 100 mL of tetrahydrofuran was added 18 g of the polymer of Formula 3, 10 mg of p-toluene sulfonic acid, and 3.5 g of tert-butylvinylether. The resulting solution was stirred at 10° C. for 8 hours. The solution was distilled to remove tetrahydrofuran. The polymer was precipitated and filtered in petroleum ether. And the polymer was washed with a weak base (5% aqueous $Na_2CO_3$ solution), and washed again with distilled water to remove the residual base. The resultant polymer was vacuum-dried to obtain the polymer of Formula 4a (yield 81%).

EXAMPLE 2

Synthesis of Polymer of Chemical Formula 4b

To 100 mL of tetrahydrofuran was added 18 g of the polymer of Formula 3, 10 mg of p-toluene sulfonic acid, and 3.5 g of ethylvinylether. The resulting solution was stirred at 10° C. for 8 hours. Tetrahydrofuran was removed by distillation. The polymer was precipitated and filtered in petroleum ether, and washed successively with a weak base (5% aqueous $Na_2CO_3$ solution) and distilled water. The resultant polymer was vacuum-dried to obtain the polymer of Formula 4b (yield 83%).

EXAMPLE 3

Synthesis of Polymer of Chemical Formula 4c

To 100 mL of tetrahydrofuran was added 18 g of the polymer of Formula 3, 10 mg of p-toluene sulfonic acid, and 3.5 g of cylcohexylvinylether. The resulting solution was stirred at 10° C. for 8 hours. Tetrahydrofuran was removed by distillation. The polymer was precipitated and filtered in petroleum ether, and washed successively with a weak base (5% aqueous $Na_2CO_3$ solution) and distilled water. The resultant polymer was vacuum-dried to obtain the polymer of Formula 4c (yield 82%).

II. Preparation of Photoresist Composition and Formation of Pattern

EXAMPLE 4

To 100 g of propylene glycol methyl ethyl acetate (PGMEA) was added 10 g of the polymer prepared in Example 1, 0.06 g of phthalimidotrifluoromethane sulfonate and 0.06 g of triphenylsulfonium triflate. The resulting mixture was stirred and filtered through a 0.20 μm filter.

The photoresist composition thus prepared was spin-coated on a silicon wafer, and soft-baked in an oven or hot plate at 130° C. for 90 seconds. After baking, the photoresist was exposed to light using an ArF laser exposer, and then post-baked at 130° C. for 90 seconds. When the post-baking was completed, it was developed in 2.38 wt % aqueous TMAH solution for 40 seconds, to obtain an ultrafine pattern.

EXAMPLE 5

To 100 g of propylene glycol methyl ethyl acetate (PGMEA) was added 10 g of the polymer prepared in Example 2, 0.06 g of phthalimidotrifluoromethane sulfonate and 0.06 g of triphenylsulfonium triflate. The resulting mixture was stirred and filtered through a 0.20 μm filter.

The photoresist composition thus prepared was spin-coated on a silicon wafer, and soft-baked in an oven or hot plate at 130° C. for 90 seconds. After baking, the photoresist was exposed to light using an ArF laser exposer, and then post-baked at 130° C. for 90 seconds. When the post-baking was completed, it was developed in 2.38 wt % aqueous TMAH solution for 40 seconds, to obtain an ultrafine pattern.

EXAMPLE 6

To 100 g of propylene glycol methyl ethyl acetate (PGMEA) was added 10 g of the polymer prepared in Example 3, 0.06 g of phthalimidotrifluoromethane sulfonate and 0.06 g of triphenylsulfonium triflate. The resulting mixture was stirred and filtered through a 0.20 μm filter.

The photoresist composition thus prepared was spin-coated on a silicon wafer, and soft-baked in an oven or hot plate at 130° C. for 90 seconds. After baking, the photoresist was exposed to light using an ArF laser exposer, and then post-baked at 130° C. for 90 seconds. When the post-baking was completed, it was developed in 2.38 wt % aqueous TMAH solution for 40 seconds, to obtain an ultrafine pattern.

Photoresist compositions prepared using polymers of the present invention have excellent transmittance at wavelength of 157 nm. In addition, PR compositions of the present invention have an excellent etching resistance, heat resistance and adhesiveness. Furthermore, PR compositions of the present invention can be easily developed in 2.38 wt % aqueous TMAH solution. Therefore, photoresist compositions of the present invention can be advantageously used as a 157 nm wavelength photoresist layer in a semiconductor device.

The foregoing discussion of the invention has been presented for purposes of illustration and description. The foregoing is not intended to limit the invention to the form or forms disclosed herein. Although the description of the invention has included description of one or more embodiments and certain variations and modifications, other variations and modifications are within the scope of the invention, e.g., as may be within the skill and knowledge of those in the art, after understanding the present disclosure. It is intended to obtain rights which include alternative embodiments to the extent permitted, including alternate, interchangeable and/or equivalent structures, functions, ranges or steps to those claimed, whether or not such alternate, interchangeable and/or equivalent structures, functions, ranges or steps are disclosed herein, and without intending to publicly dedicate any patentable subject matter.

What is claimed is:

1. A photoresist polymer of the Formula:

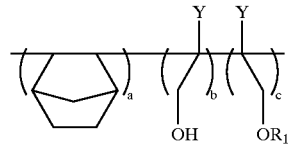

4 wherein

Y is H;

$R_1$ is a hydroxy protecting group; and the ratio of a:b:c is 10–90 mol %:5–45 mol %:5–45 mol %.

2. The photoresist polymer according to claim 1, wherein said hydroxy protecting group is an acetal.

3. The photoresist polymer according to claim 2, wherein said acetal is of the formula —$CH(CH_3)OR_4$, wherein $R_4$ is optionally substituted linear or branched ($C_1$–$C_{20}$) alkyl or aryl, or 5–7 membered cyclic lactam.

4. The photoresist polymer according to claim 3, wherein said polymer is selected from the group consisting of compounds of the Formulas:

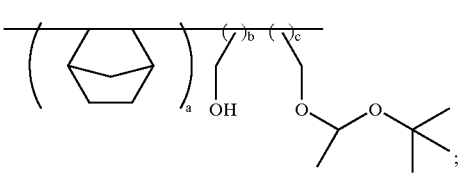

4a

-continued

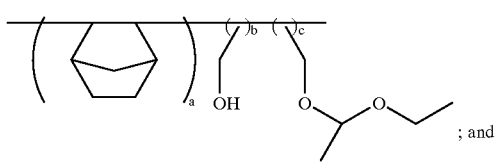

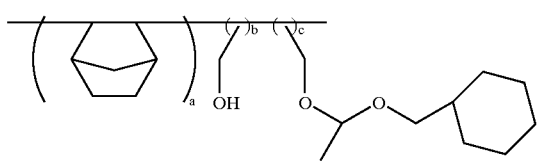

wherein the ratio of a:b:c is 10–90 mol %:5–45 mol %:5–45 mol %.

5. A process for preparing a photoresist polymer of the formula:

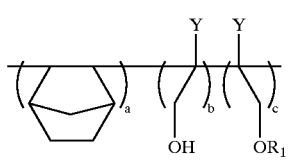

said process comprising the steps of:

(a) polymerizing a mixture of norbornylene and a maleic anhydride derivative under conditions sufficient to produce a polymer of the Formula:

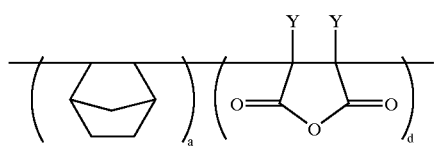

(b) reducing said polymer of Formula 1 with a reducing agent under conditions sufficient to produce a polymer of the Formula:

and (c) reacting said polymer of Formula 3 with a hydroxy protecting group precursor under conditions sufficient to produce at least a partially protected hydroxy polymer of the Formula:

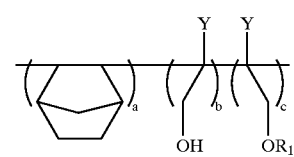

wherein
Y is H;
$R_1$ is a hydroxy protecting group;
the ratio of a:d is 10–90 mol %:10–90 mol %; and
the ratio of a:b:c is 10–90 mol %:5–45 mol %:5–45 mol %.

6. The process according the claim 5, wherein said reducing step further comprises the steps of:
(i) contacting said polymer of Formula 1 with an alcohol of the formula $R_5OH$ under conditions sufficient to produce a polymer of the Formula:

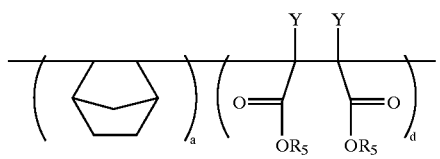

and
(ii) contacting said polymer of Formula 2 with said reducing agent under conditions sufficient to produce said polymer of Formula 3,
wherein
a, d and Y are those defined in claim 5, and
$R_5$ is $(C_1–C_5)$ alkyl.

7. The process according to claim 6, wherein said reducing agent is $NaBH_4$.

8. The process according to claim 5, wherein said reducing agent is $LiAlH_4$.

9. The process according to claim 5, wherein said hydroxy protecting group precursor is a $(C_1–C_{20})$ alkyl or aryl vinyl ether compound.

10. A photoresist composition comprising:
(i) a photoresist polymer of the formula:

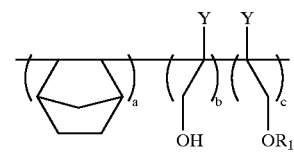

wherein
Y is H;
$R_1$ is a hydroxy protecting group; and
the ratio of a:b:c is 10–90 mol %:5–45 mol %:5–45 mol %,
(ii) a photoacid generator, and
(iii) an organic solvent.

11. The photoresist composition according to claim 10, wherein said photoacid generator is selected from the group consisting of phthalimidotrifluoromethane sulfonate, dinitrobenzyltosylate, n-decyl disulfone and naphthylimido trifluoromethane sulfonate.

12. The photoresist composition according to claim 10, wherein said photoacid generator further comprises a compound selected from the group consisting of diphenyl iodide hexafluorophosphate, diphenyl iodide hexafluoroarsenate, diphenyl iodide hexafluoroantimonate, diphenyl p-methoxyphenyl triflate, diphenyl p-toluenyl triflate, diphenyl p-isobutylphenyl triflate, triphenylsulfonium hexafluoroarsenate, triphenylsulfonium hexafluoroantimonate, triphenylsulfonium triflate, dibutyl-naphthylsulfonium triflate, and mixtures thereof.

13. The photoresist composition according to claim 10, wherein the amount of photoacid generator is in the range of from about 0.1 to about 10% by weight of said photoresist polymer.

14. The photoresist composition according to claim 10, wherein said organic solvent is selected from the group consisting of ethyl 3-ethoxypropionate, methyl 3-methoxypropionate, cyclohexanone, propylene glycol methyl ether acetate, n-heptanone and ethyl lactate.

15. The photoresist composition according to claim 10, wherein the amount of organic solvent is in the range of from about 400 to about 1500% by weight of said photoresist polymer.

16. A process for forming a photoresist pattern, comprising the steps of:

(a) coating a photoresist composition on a substrate of semiconductor device to form a photoresist film, wherein said photoresist composition comprises:

(i) a photoresist polymer of the formula:

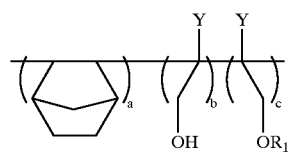

4 wherein
Y is H;
$R_1$ is a hydroxy protecting group; and
the ratio of a:b:c is 10–90 mol %:5–45 mol %:5–45 mol %, (ii) a photoacid generator, and
(iii) an organic solvent, (b) exposing said photoresist film to light using a light source; and
(c) developing said exposed photoresist film.

17. The process according to claim 16, further comprising a baking step(s) before and/or after exposure of step (b).

18. The process according to claim 17, wherein said baking step is performed at temperature in the range of from about 70 to about 200° C.

19. The process according to claim 16, wherein said light source is selected from the group consisting of ArF, KrF, EUV, VUV, E-beam, X-ray and ion beam.

20. The process according to claim 16, wherein the exposure light energy of said step (b) is in the range of from about 1 to about 30 mJ/cm$^2$.

* * * * *

UNITED STATES PATENT AND TRADEMARK OFFICE
CERTIFICATE OF CORRECTION

PATENT NO. : 6,455,226 B1
DATED : September 24, 2002
INVENTOR(S) : Geun Su Lee et al.

It is certified that error appears in the above-identified patent and that said Letters Patent is hereby corrected as shown below:

Column 1,
Lines 38-40, the sentence "Furthermore, during a post-exposure bake (PEB) process these photoresist can generate HF which can contaminate a lens or corrode a device." should read -- Furthermore, during a post-exposure bake (PEB) process these photoresists can generate HF which can contaminate a lens or corrode a device. --

Column 2,
Lines 31-32, the phrase "the total amount "a" of polymeric units derived from norborylene of Formula 4 above can be inter dispersed" should read -- the total amount "a" of polymeric units derived from norbornene of Formula 4 above can be inter dispersed --.

Column 3,
Line 22, the phrase "(a) polymerizing norbornylene and a maleic anhydride" should read -- (a) polymerizing norbornene and a maleic anhydride --.

Column 4,
Lines 35-67, please replace Reaction Formula 1 with the following Reaction Formula 1:

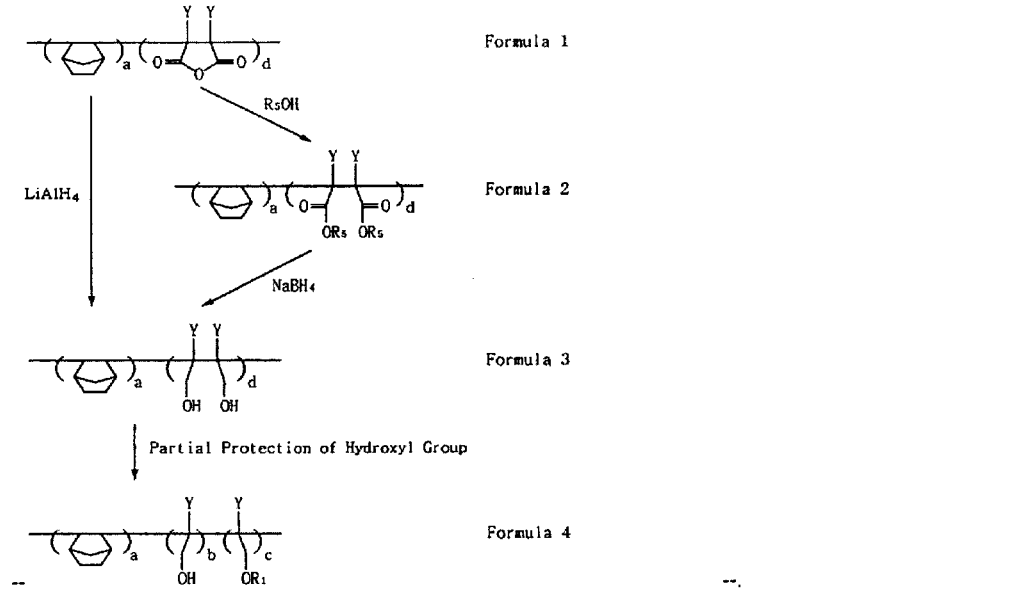

UNITED STATES PATENT AND TRADEMARK OFFICE
CERTIFICATE OF CORRECTION

PATENT NO.   : 6,455,226 B1
DATED        : September 24, 2002
INVENTOR(S)  : Geun Su Lee et al.

It is certified that error appears in the above-identified patent and that said Letters Patent is hereby corrected as shown below:

Column 6,
Line 18, the phrase "norbornylene, 0.2M of maleic anhydride and 0.4 g of AIBN." should read -- norbornene, 0.2M of maleic anhydride and 0.4 g of AIBN. --

Column 9,
Line 36, the phrase "(a) polymerizing a mixture of norbornylene and a maleic" should read -- (a) polymerizing a mixture of norbornene and a maleic --.

Column 10,
Lines 15-16, the phrase "The process according the claim 5, wherein said reducing step further comprises the steps of:" should read -- The process according to claim 5, wherein said reducing step further comprises the steps of: --

Signed and Sealed this

Twenty-seventh Day of July, 2004

JON W. DUDAS
*Acting Director of the United States Patent and Trademark Office*